United States Patent [19]

O'Toole et al.

[11] Patent Number: 5,152,880
[45] Date of Patent: Oct. 6, 1992

[54] ELECTRODEPOSITION OF A POLYMER

[75] Inventors: Terrence R. O'Toole, Hopewell Junction; Alfred Viehbeck, Stormville, both of N.Y.

[73] Assignee: International Business Machines Corporation, Armonk, N.Y.

[21] Appl. No.: 676,660

[22] Filed: Mar. 28, 1991

[51] Int. Cl.⁵ ............................................. C25D 13/10
[52] U.S. Cl. .............................. 204/181.4; 204/181.6; 204/181.7; 204/59 R
[58] Field of Search ............... 204/59 R, 181.4, 181.6, 204/181.7

[56] References Cited

U.S. PATENT DOCUMENTS

| | | | |
|---|---|---|---|
| 3,911,475 | 10/1975 | Szedon et al. | 204/181.6 |
| 3,974,324 | 8/1976 | Lupinski et al. | 204/181.6 |
| 4,053,444 | 11/1977 | Phillips | 204/181.6 |
| 4,180,442 | 12/1979 | Byrd | 204/14 N |
| 4,414,080 | 11/1983 | Williams et al. | 204/129 |
| 4,474,658 | 10/1984 | Alvino et al. | 204/181.4 |
| 4,482,446 | 11/1984 | Streitberger et al. | 204/181 C |
| 4,512,855 | 4/1985 | Mazur | 205/50 |
| 4,533,448 | 8/1985 | Scala et al. | 204/181.7 |
| 4,760,105 | 7/1988 | Fuller et al. | 523/420 |
| 4,832,808 | 5/1989 | Buchwalter | 204/181.7 |
| 4,869,796 | 9/1989 | Kanda et al. | 204/181.6 |
| 4,895,673 | 1/1990 | Alvino et al. | 252/308 |
| 4,933,052 | 6/1990 | O'Brien et al. | 204/58.5 |
| 5,021,129 | 6/1991 | Arbach et al. | 205/126 |

Primary Examiner—John Niebling
Assistant Examiner—Kishor Mayekar
Attorney, Agent, or Firm—Pollock, Vande Sande & Priddy

[57] ABSTRACT

A polyimide is deposited onto a conductive substrate by providing a composition containing the polyimide and an electrolyte and/or reducing agent, providing the substrate and a counter electrode in the composition, and providing a bias between the substrate and counter electrode to thereby deposit the polyimide on the substrate.

21 Claims, No Drawings

ELECTRODEPOSITION OF A POLYMER

DESCRIPTION

1. Technical Field

The present evaluation is concerned with depositing a polymeric material and especially a polyimide onto a conductive substrate in its imidized form. The present invention is particularly concerned with direct electrodeposition of the polyimide onto a substrate.

2. Background Art

Polyimides are commonly employed in the semiconductor and packaging industry. Polyimides are usually employed for metal passivation or conductor insulation, particularly, because the polyimides exhibit low dielectric characteristics along with high thermal and chemical stability.

In the packaging of semiconductor chips, polyimide films are often coated onto substrates. Typically, a polyamic acid or alkyl ester precursor of the polyimide is applied by spin coating onto the desired substrate, and subsequently cured by thermal excursions of up to about 400° C. However, one problem associated with such a process is that the polyimide precursors employed are reactive with metals such as copper. This in turn causes oxidation of the metal which leads to the incorporation of metal oxide into the polymer bulk during the curing cycle. The presence of the metal oxide adversely affects the dielectric properties of the polyimide and the reliability of the metal-polyimide interface. Another problem associated with applying the polyamic acid or polyamic ester precursor is that the heating results in imidization, i.e., ring closure with concurrent release of water (for polyamic acids) or alcohol (for polyamic esters).

This curing process results in weight loss and dimensional changes in the polymer such as shrinking. This concern can be minimized by applying a preimidized polyimide coating. However, most polyimides, especially those possessing the best packaging properties are not soluble and therefore cannot be applied in the imidized form.

SUMMARY OF INVENTION

This invention presents a method by which polyimides (in the imidized form) can be deposited onto a conductive surface. The present invention makes it possible to deposit polyimides onto conductive surfaces, such as copper circuitry, without experiencing the problems discussed above associated with employing polyimide precursor polyamic acid material. The present invention makes it possible to deposit a cured polyimide onto an electrically conductive substrate. One advantageous aspect of the present invention is the ability to apply a wide variety of preimidized polyimides, including those which are normally insoluble and, therefore, cannot be cast from solution.

In particular, the present invention comprises depositing a coating onto an electrically conductive substrate by providing a liquid composition containing an electrolyte and/or reducing agent and a polyimide in its soluble, reduced form; providing an electrically conductive substrate in the liquid composition; providing a counter electrode in the liquid composition; and providing an electrical bias between the substrate and the counter electrode to thereby deposit the polyimide onto the electrically conductive substrate.

PREFERRED AND VARIOUS EMBODIMENTS FOR CARRYING OUT INVENTION

The polyimides employed pursuant to the present invention are capable of being reduced, i.e., accepting electrons in a reversible manner. Normally, the polyimides undergo reversible electron transfer processes at relatively moderate potentials (e.g., $-0.7$ to $-1.3V$ vs. saturated calomel electrode, sce). In their reduced form, polyimides are usually much more soluble than in their neutral, oxidized form.

The polyimides that can be employed in accordance with the present invention include unmodified polyimides, as well as modified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

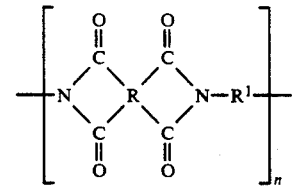

where n is an integer representing the number of repeating units to provide a molecular weight usually about 10,000 to about 100,000. R is at least one tetravalent organic radical selected from the group consisting of:

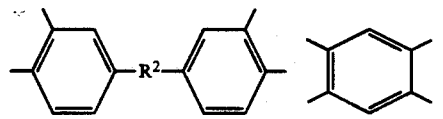

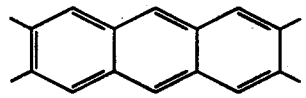

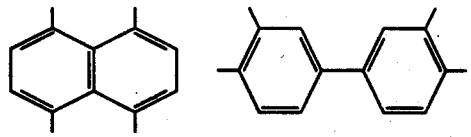

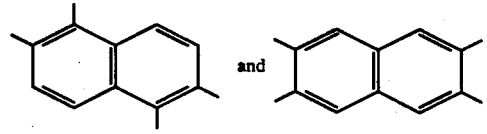 and

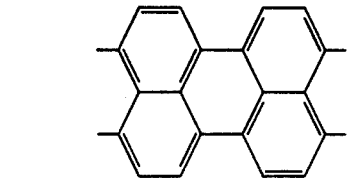

$R^2$ being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which $R^1$ is at least one divalent radical selected from the group consisting of an aliphatic organic radical or from the group shown:

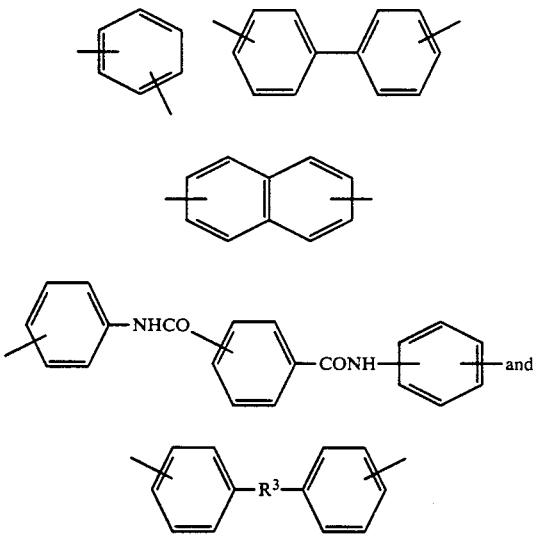

in which $R^3$ is a divalent organic radical selected from the group consisting of $R^2$, silico, and amino radicals. Polymers containing two or more of the R and/or $R^1$ radicals, especially multiple series of $R^1$ containing amido radicals, can be used.

Polyimides are available commercially from a variety of suppliers including (a) fully cured pre-imidized polyimide films (e.g., Dupont Kapton ® film); (b) fully cured preimidized powders (e.g., Ciba-Geigy Matrimid 5218 ®); (c) solutions of pre-imidized polyimides (e.g., Ciba-Geigy Probimide); and (d) polyimide precursors, most notably polyamic acids (e.g. DuPont 2545 and 2611) and polyamic esters. The chemistry of commercial polyimides includes examples of many of the components listed above, but preferred polymers for use pursuant to the present invention are based on the monomers pyromellitic dianhydride (PMDA) and oxydianiline (ODA, also named 4,4'-diaminodiphenyl ether) or 3, 3', 4, 4'- benzophenone tetracarboxylic dianhydride (BTDA) and diamino - 1, 3, 3 - trimethyl-1-phenylindan (DAPI). Other polymers for use pursuant to the present invention are the polymers of 3, 3'-biphenylenetetracarboxylic acid (BPDA) and 1,4-phenylenediamine (PDA). Polyimide films based on PMDA-ODA are available from Allied Corporation under the tradename Apical ® and from DuPont under the tradename Kapton ®. Polymides based on BTDA-DAPI are available from Ciba Geigy as XU-218 ®. Films based on BPDA-PDA are available from Ube Corporation as Upilex ® and from Hitachi Chemical Company as PIQ-L100 ®. Other tradename polyimides useful pursuant to the present invention include Durimid ® from Rogers Corporation.

According to the present invention, a solution containing the cured (imidized) polyimide and an electrolyte and/or reducing agent is employed. When a reducing agent is employed, such must have an oxidation potential that is negative with respect to the reduction potential of the polyimide. Compounds such as benzil anion, anthraquinone anion, benzophenone anion, benzoin dianion, sodium naphthalenide, anion of N,N'-di-n-butylpyromellitimide, tetrakis(dimethylamino) ethylene and even solvated electrons can be used as the reducing agent.

The reducing agents can be reducing agents, per se, or produced such as in situ by electrochemical means. The reducing agents can be generated by chemical reaction such as by reacting benzoin and potassium tert-butoxide which produces benzoin dianion.

Examples of suitable organic compounds that can be electrochemically reduced to provide the chemical reducing agent include, but are not limited to, the following groups of compounds: unsaturated aromatic hydrocarbons (e.g., anthracene), aldehydes and ketones (e.g., benzaldehyde, dibenzoylmethane), imides (e.g., N-n-butylphthalimide, N,N'-di-n-butyl-3,3', 4,4'-biphenyl tetracarboxylic diimide), carbodiimides (e.g., bis-(p-chlorophenyl carbodiimide), aromatic heterocyclic nitrogen compounds (e.g., 9, 10-diazaphenanthrene), anhydrides (e.g., 1,8-naphthalic anhydride, 3,3', 4,4'-benzophenone tetracarboxylic dianhydride), quinones (e.g., 9,10-anthraquinone), quaternary aromatic nitrogen compounds (e.g., 1-ethylpyridinium bromide), azomethines (e.g., N-p-biphenylbenzalimine), immonium salts (e.g., N-ethyl-N-methyl benzophenone immonium salt), azo compounds (e.g., 4,4'-azobiphenyl), amine oxides (e.g., acridine N-oxide), and organometallic compounds (e.g., dibiphenylchromium (I) iodide).

Benzil, N-butylphthalimide, benzophenone and anthracene are examples of specific compounds that can be reduced to provide the chemical reducing agents suitable for carrying out the present invention. The compounds can be reduced by applying such to an electrochemical cell containing an anode and a cathode and then applying a voltage.

Typically, bulk electrochemical reduction is done using a two-compartment cell whereby the compartments are separated by a sintered glass disk or frit having a porosity of less than 8 µm. A salt bridge or semipermeable membrane also could be used to separate the compartments. The working compartment is housed with a cathode electrode which is comprised of a metal such as platinum, mercury, or stainless steel. The anode electrode is comprised of a conductor such as platinum, carbon, or stainless steel. For potentiostatic operation, an appropriate reference electrode is positioned in the working compartment (e.g., a saturated calomel electrode (SCE)). The cell can be purged with an inert gas such as $N_2$ or argon using an inlet tube and one-way valve or operation can be done in a glove box under an inert atmosphere.

Electrochemical generation of the reducing agent is accomplished by either galvanostatic, potentiostatic, or voltage-controlled electrolysis. Typically, the current density range for galvanostatic reduction is 0.1 to 2 $mA/cm^2$. In potentiostatic mode, reduction is typically done by applying a potential to the cathode which is more negative (e.g., −50 mV or more) than the reduction potential for the organic compounds as measured against the same reference electrode.

Instead of or in addition to the solution containing the reducing agent will include an electrolyte and preferably an electrolyte salt that contains as cation a member from one of the following groups: tetraalkylammonium, tetraalkylphosphonium, alkali metal, aryl-alkylammonium, or chelated metal. The preferred tetraalkylammonium group is tetrabutylammonium, but other tetraalkyls with alkyl group being methyl, ethyl, propyl, isopropyl, pentyl, hexyl, or mixed alkyl thereof can be employed if desired. An example of a typical aryl group is phenyl and an aryl-alkylammonium is benzyltributylammonium. An example of a chelated metal cation is potassium 18-crown-6. The electrolyte salt preferably contains as an anion one of the following: tetrafluoroborate, hexafluorophosphate, aryl sulfonate, perchlorate, or halide such as bromide or iodide. The solution containing the polyimide is preferably comprised of an aprotic solvent or solvent mixture. The requirements for the solvent are that it:

1) solvate electrolyte sufficiently to carry out electrochemical processes;
2) solvate the polyimide in its reduced form;
3) not solvate the polyimide in its neutral, oxidized form;
4) not react chemically with the polyimide in either its reduced or neutral form.

The aprotic solvents suitable for use in this invention include, but are not limited to, the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide), ester, cyclic ester, and ether compounds (e.g., propylene carbonate, ethylene carbonate, gamma-butyrolactone, ethyl acetate, tetrahydrofuran, dimethylether), oxide and sulfo compounds (e.g., dimethylsulfoxide, acetone, sulfolane, dimethylsulfone).

Although reference is made to a solution employing the polyimide, and reducing agent and/or electrolyte, it is understood that separate solutions of such can be admixed to provide the desired composition.

The concentration of the reduced polyimide in the solution is usually about 0.0005 to about 0.05M, and preferably above 0.002M.

In the case where the neutral polyimide is not soluble in common solvents (e.g., Kapton ®), the solid polyimide film is typically added to a solution containing the monomeric reducing agent. Electron transfer from the reducing agent to the polyimide results in dissolution of the reduced polyimide.

In the case where the polyimide can be solubilized in select solvents (e.g., XU-218 ® in N-methylpyrrolidinone (NMP)), reduction of the polyimide can be done directly at an electrode surface or by using a reducing agent. Following generation of the reduced form, another solvent is mixed in, such that the reduced form is still soluble but the neutral form will not be.

When employed, the concentration electrolyte in solution is usually about .1 to about 0.01 M, preferably about 0.2 to about 0.05 M.

When employed, the concentration of the reducing agent is usually about 0.001M to about 0.05M and preferably about 0.002M to about 0.005M.

The substrate that is to be coated with the polyimide is placed in the solution and is an electrically conductive material, such as palladium, platinum, silver, gold, copper, cobalt, and nickel, with copper being preferred. The present invention can also be employed to deposit polyimide onto conductive polymers such as polyaniline, polypyrrole, and polythiophene, onto conducting glass, and onto superconductors.

By following the process of the present invention it is possible to selectively coat only predetermined areas of a substrate whereby only exposed conductive material is coated and those portions of the substrate that do not include conductive material and/or have the conductive material already masked with a material or resin which could not be activated by the process of the present invention will not be coated. This is of importance for the fabrication of advanced second level circuit cards which typically contain through vias that are metallized permitting electrical connection between top and bottom surfaces. High density cards also often contain buried metal layers or metal cores which must be electrically isolated from the metallized vias. In fabricating the vias by drilling, punching, etching, or ablating, subsequent insulation of the exposed metal core is often problematic. By direct electrodeposition of imidized polyimide, these exposed metal regions can be coated to isolate the core. This approach also permits the application of the same polyimide used for the top and bottom insulating layers.

The conductive substrate when a bias is applied will function as an electrode whereat the polyimide will deposit with it giving up electrons and reverting back to its neutral state. Also provided in the solution is a counter electrode with a bias applied between it and the substrate. The counter electrode is a material that is relatively non-reactive in the system such as platinum or carbon.

The potential applied to the working electrode is typically about 0.05 V and preferably about 0.5V to about 2.0V more positive than the reduction potential of the polyimide.

The first electron-reduction potential E° for various polyimides are given:

|  |  | $E°_1$ |
| --- | --- | --- |
| PMDA-ODA | (Kapton ®) | −0.78 |
| BPDA-PDA | (Upilex ®) | −1.34 |
| BTDA-DAPI[1] | (XU-218 ®) | −1.04 |
| BTDA-APB[3] | (Thermid ®) | −0.96 |
| NTDA-ODA[2] |  | −0.64 |

E° is referenced versus the saturated calomel electrode and determined by cyclic voltammetry in 0.1M tetrabutylammonium tetrafluoroborate in acetonitrile.
[1]BTDA-DAPI is 3,3', 4,4'-benzophenone tetracarboxylic dianhydride-diamino-1,3,3-trimethyl-1-phenylindan which is commercially available from Ciba-Geigy under the tradename XU-218 ®.
[2]NTDA-ODA is 1,4,5,8-naphthalene tetracarboxylic dianhydride-4,4'-oxydianiline.
[3]BTDA-APB is 3,3'-4,4'-benzophenone tetracarboxylic dianhydride-1,3-bis-(2-aminophenoxy)benzene which is commercially available from National Starch and Chemical Company under the tradename Thermid ®.

The process is usually carried out at room temperature under inert atmosphere for about 10 minutes to about 5 hours, preferably about 1 to about 3 hours in order to provide the desired thickness of polyimide.

The following non-limiting examples are presented to further illustrate the present invention:

EXAMPLE 1

Into a 200 ml DMF solution containing 0.1 M tetrabutylammonium tetrafluoroborate and 0.005 M anthracene are placed 0.44 g of 1 mil Kapton strips. This mixture comprises the working compartment.

A Pt mesh working electrode and a saturated calomel reference electrode (SCE) are placed in the working compartment. A Pt mesh electrode is placed in the auxilliary compartment containing 0.1 M tetrabutylammonium tetrafluroborate in DMF and is separated from the working solution by a medium porosity glass frit.

A potential of −2.0V vs SCE is applied at the working electrode. The solution color first turns blue as the anthracene radical anion is generated and then turns to violet, due to the mixture of the anthracene anion and the red, doubly reduced Kapton dianion. Enough current is passed to convert all of the Kapton to the soluble dianion. Excess anthracene anion is reoxidized.

Electrochemical deposition onto platinum or conductive glass electrodes is accomplished by applying a potential of −0.45V which is sufficient to oxidize the dianion to the neutral, insoluble form. Electrons can continue to be delivered from reduced polymer in solution to the outermost film layer and propagate through the film to the electrode by electron self-exchange. After 1 hour, the electrode is removed and it is observed that the material is still somewhat green indicating the presence of some monoanion, but little enough so that the polymer film is insoluble in DMF. The 1 hour oxidation yields a 2-3 u thick film as determined by profilometry.

Alternatively, the red solution of the polymeric dianion can be oxidized by bulk electrolysis at −1.0V to yield the green monoanion form which is also soluble. Electrodeposition at 0.45V from this monoanion-containing solution yields results similar to those obtained by electrodeposition from the red dianion-containing solution. A 1 hour oxidation yields a film thickness of 2-3 um while a 3 hour oxidation yields 8-11 $\mu$m thick films.

EXAMPLE 2

About 8 grams of Ciba-Geigy 412 (a BTDA-based photosensitive polyimide, similar to XU-218) solution (12% in N-methylpyrrolidone) is diluted into 180 ml of dimethylformamide containing 0.1 M tetrabutylammonium tetrafluoroborate (TBABF$_4$) as electrolyte. A Pt mesh working electrode is potentiostated at −1.2 V (vs sce) resulting in the reduction of the soluble polymer. After approximately 0.5 equivalents of charge are passed (i.e., 1 electron per 2 BTDA units) the electrolysis is stopped. To 50 ml of this solution, 30 ml of 0.1 M TBABF$_4$ in acetonitrile are added. This amount of acetonitrile is enough to make the neutral form insoluble while maintaining the solubility of the reduced polyimide. When a Pt or Cu electrode is potentiostated positive of the reduction potential for the polyimide (positive of −1.1 V in this example), electron transfer from the polymer to the electrode occurs generating the neutral, insoluble polymer which deposits onto the electrode surface. After 1 hour, a rather coarse 2 $\mu$m thick film is deposited onto the surface. Its photochemical properties are retained and the film can be imaged using the same conditions used to image spin cast films.

What is claimed is:

1. A method for depositing a coating on electrically conductive substrate which comprises providing a liquid composition containing a cured polyimide in its reduced form and a member selected from the group consisting of electrolyte, reducing agent and mixtures thereof, and wherein said reducing agent has an oxidation potential that is negative with respect to the reduction potential of the polyimide, providing an electrically conductive substrate in said composition, providing a counter electrode in said composition; and providing an electrical bias between said substrate and said counter electrode to thereby deposit said polyimide onto said electrically conductive substrate.

2. The method of claim 1 wherein said polyimide is a fully cured polyimide from pyromellitic dianhydride and oxydianiline.

3. The method of claim 1 wherein said polyimide is a fully cured polyimide from benzophenone tetracarboxylic dianhydride and diamino-1,3,3-trimethyl-1-phenyl-indan., 4. The method of claim 1 wherein said reducing agent is selected from the group consisting of anthracene anion, N-butylphthalimide anion, benzil anion, benzophenone anion, benzoin dianion, sodium naphthalenide, anion of N,N'-di-n-butyl-pyromellitimide and tetrakis (dimethylamino) ethylene.

5. The method of claim 1 wherein said electrolyte contains a cation selected from the group consisting of tetraalkylammonium, tetraalkylphosphonium, alkali metal, aryl-alkyl-ammonium, tetraalkylammonium, and chelated metal.

6. The method of claim 5 wherein said electrolyte contains an anion selected from the group consisting of tetrafluoroborate, hexafluorophosphate, aryl sulfonate, perchlorate, and halide.

7. The method of claim 1 wherein said composition contains an aprotic solvent or solvent mixture.

8. The method of claim 7 wherein said aprotic solvent or mixture is selected from the group consisting of nitrile compound, nitro compound, amide, cyclic amide, ester, cyclic ester, ether, oxide and sulfo compound.

9. The method of claim 7 wherein said aprotic solvent or mixture is selected from the group consisting of N,N dimethylformamide, N-methyl-2-pyrrolidone and acetonitrile.

10. The method of claim 1 wherein the concentration of said polyimide in the composition is about 0.0005M to about 0.05M.

11. The method of claim 1 wherein the concentration of the electrolyte in the composition is about 1 to about 0.01 M.

12. The method of claim 1 wherein the concentration of the electrolyte in the composition is about 0.2 to about 0.05M.

13. The method of claim 1 wherein the concentration of the reducing agent is about 0.001M to about 0.05M.

14. The method of claim 1 wherein said substrate is a metal selected from the group consisting of palladium, platinum, silver, gold, copper, cobalt and nickel.

15. The method of claim 1 wherein said substrate is copper.

16. The method of claim 1 wherein said substrate is a conductive polymer, conductive glass, or superconductor.

17. The method of claim 1 wherein said bias generates a working electrode potential that is about 50 mV to about 2V more positive than the reduction potential of said polyimide.

18. The method of claim 1 wherein said counter electrode is platinum.

19. The method of claim 1 wherein said electrolyte is tetrabutylammonium tetrafluoroborate.

20. The method of claim 1 wherein said reducing agent is anthracene anion.

21. The method of claim 1 wherein cured polyimide in its reduced form is dissolved in said liquid composition.

* * * * *